United States Patent [19]
Küecher

[11] Patent Number: 4,924,295
[45] Date of Patent: May 8, 1990

[54] INTEGRATED SEMI-CONDUCTOR CIRCUIT COMPRISING AT LEAST TWO METALLIZATION LEVELS COMPOSED OF ALUMINUM OR ALUMINUM COMPOUNDS AND A METHOD FOR THE MANUFACTURE OF SAME

[75] Inventor: Peter Küecher, Regensburg, Fed. Rep. of Germany

[73] Assignee: Siemens Aktiengesellschaft, Berlin and Munich, Fed. Rep. of Germany

[21] Appl. No.: 107,344

[22] Filed: Oct. 13, 1987

[30] Foreign Application Priority Data

Nov. 28, 1986 [DE] Fed. Rep. of Germany ....... 3640656

[51] Int. Cl.$^5$ .............................................. H01L 23/48
[52] U.S. Cl. ........................................ 357/71; 357/67; 357/69
[58] Field of Search ...................... 357/71, 715, 67, 69

[56] References Cited

U.S. PATENT DOCUMENTS

| | | | |
|---|---|---|---|
| 3,614,547 | 10/1971 | May | 357/71 |
| 4,107,726 | 8/1978 | Schilling | 357/715 |

FOREIGN PATENT DOCUMENTS

| | | | |
|---|---|---|---|
| 57-48259 | 3/1982 | Japan | 357/71 |
| 57-208161 | 12/1982 | Japan | 357/71 |
| 60-119755 | 6/1985 | Japan | 357/71 |
| 61-174767 | 8/1986 | Japan | 357/71 |

OTHER PUBLICATIONS

Gniewek et al., "Titanium Overlay on Metallurgy", IBM Technical Disclosure Bulletin, vol. 13, No. 5, Oct. 1970, p. 1124.
Journal of Vac. Sci. Technology, A2, Apr.–Jun. 1984, pp. 241–242, Kwok et al., "Summary Abstract: Electromigration Studies of Al–Intermetallic Structures".

*Primary Examiner*—Andrew J. James
*Assistant Examiner*—Ngan Van Ngo
*Attorney, Agent, or Firm*—Hill, Van Santen, Steadman & Simpson

[57] ABSTRACT

An improved planarization and reliability for low-impedance interconnects in multi-layer wiring of integrated semi-conductor circuits is provided. The circuit comprises at least two metallization levels composed of aluminum or of an aluminum contact, tungsten is employed as a via hole filler and metal silicides are employed as intermediate layers. The metallization pattern contains a nucleation layer preferably composed of titanium/titanium nitride as an under-layer for every metallization level, whereby the electron migration resistance of the aluminum layers is enhanced and a layer preferably composed of molybdenum silicide is used as a cover layer for every metallization level, thereby improving the low-impedance of the metallization. The sandwich-like metallization structure improves the planarity and the thermal stability of the circuit. Since the number of metallization levels is arbitrary, the present invention can be used for VLSI circuits.

13 Claims, 3 Drawing Sheets

INTEGRATED SEMI-CONDUCTOR CIRCUIT COMPRISING AT LEAST TWO METALLIZATION LEVELS COMPOSED OF ALUMINUM OR ALUMINUM COMPOUNDS AND A METHOD FOR THE MANUFACTURE OF SAME

BACKGROUND OF THE INVENTION

The present invention, in general, relates to integrated semi-conductor circuits. More specifically, the present invention is directed to an integrated semi-conductor circuit comprising a substrate composed of silicon in/on which the elements defining the circuits are generated. The circuit comprises at least two metallization levels composed of aluminum or aluminum compounds that are separated by an insulating layer. The metallization levels are connected to one another, and to the regions in/on the silicon substrate to be contacted, by use of metal silicide intermediate layers and via hole fillers composed of tungsten.

Structures in the range of 1 um and below are known and utilized in the progressive miniaturization of semi-conductor components. In order to be able to electrically drive the resultant extremely small, active regions on the semi-conductor substrate, it is necessary to use metallic interconnects. The interconnects are separated from the semi-conductor substrate by an insulating layer, composed of for example $SiO_2$, so that contact only occurs at defined locations. The connection to the active regions of the semi-conductor substrate ensues via contact holes which are etched into the insulating layer.

VLSI semi-conductor circuits are similar in construction wherein two or more interconnect levels are required for the electrical supply of the extremely densely packed, active regions. Likewise, the electrical contact between the various interconnect levels must be produced utilizing very small holes (referred to as via holes).

Since the insulating layer must comprise a minimum thickness of approximately 0.7 to about 1.5 um due to circuit-oriented reasons (for example, parasitic capacitances), depth-to-diameter ratios of greater than or equal to one occur at the contact holes or, respectively, via holes. Given these extremely small and deep via holes, the layer thickness of the interconnects at the sidewalls of the contact hole decreases greatly (approximately a 55 to about 80% decrease) when the interconnect material, for example aluminum alloys such as aluminum-silicon (1%), are applied by cathode sputtering as heretofore was standard. Since the interconnects have extremely high current densities (for example, $1 \times 10^6$ A/cm$^2$), every cross-sectional constriction effects a local temperature rise that accelerates an undesired material transport (diffusion, reaction) at the boundary surfaces between the various materials. This local temperature rise can also lead to the burn-through of an interconnect.

A further problem that is encountered with these miniaturized semi-conductor components is that cavities can form in the via holes after the coating with, for example, aluminum-silicon. When an insulating layer is subsequently deposited thereon, for example as a foundation for a further aluminum-silicon interconnect level, then it is almost impossible to completely fill out the cavity situated in the via hole. Because reactive and/or corrosive agents can collect in this cavity during further manufacturing steps, it is necessary for reliable components to specify a contact hole or, respectively, via hole metallization pattern wherein a complete filling is achieved.

The art has developed methods that meet some of the individual requirements set forth above. The critical problem to be overcome is filling up the contact holes and providing a suitable connection to the metallization levels.

European patent application No. 86 11 00 76.6, for example, proposes that contact holes in the insulating layers, or what are referred to as via holes to more deeply placed metallization levels, be completely filled without cavities with electrically conductive material by first coating surface-wide with a metal silicide by deposition from the vapor phase. The silicide layer is then, in turn, removed again on the horizontal surface of the silicon substrate, and the contact hole is subsequently filled with metallically conductive material by selective deposition from the vapor phase. Refractory metals and their silicides are thereby employed.

A similar via hole filling method is proposed in European patent application No. 86 10 28 21.5, whereby aluminum is employed instead of the silicides and refractory metals. The aluminum is deposited surface-wide by low-pressure chemical vapor deposition (LPCVD) and is etched back to the height of the via hole.

European patent application No. P 36 15 893.3 discloses an integrated semi-conductor circuit comprising an outer interconnect level composed of aluminum or an aluminum alloy. A metal silicide intermediate layer of tantalum di-silicide is deposited for improving the current load in the via hole.

German patent application No. P 36 15 893.3 discloses the utilization of tungsten for filling via holes in the insulating layers of the integrated semi-conductor circuits. Due to the good edge coverage achieved by the CVD method, the layer grows in the via hole with roughly the same speed from all sides and fills the via hole.

SUMMARY OF THE INVENTION

The present invention provides an improved integrated semi-conductor circuit and method over the prior art utilizing a metal multi-layer system for achieving low-impedance interconnects of aluminum with high current loadability of the contacts. The present invention provides an integrated semi-conductor circuit having:

(a) a first intermediate layer of tungsten silicide (WSi$_x$) or of titanium/tungsten, titanium/tungsten nitride or titanium nitride is provided on the regions in and on the silicon substrate which are to be contacted;

(b) further intermediate layers composed of metal silicide are arranged as cover layers on the respective metallization levels; and (c) nucleation layers improving the metallization and the electromigration resistance of aluminum are respectively arranged under the metallization levels.

It thereby lies within the framework of the present invention that the cover layers are composed of molybdenum silicide (MoSi$_2$) and the nucleation layers are composed of a double layer of titanium/titanium nitride.

An advantage of the present invention is to specify a multi-layer metallization system for integrated semi-conductor circuits that meets the following demands:

1. Wirings with interconnect spacings in the sub-um range are possible;
2. The highest possible planarization for the metallization and, thus, a space-saving for the individual element is achieved; and
3. The electrical and the mechanical stability of the wiring is guaranteed, i.e., the aluminum interconnects comprise a high electromigration resistance; no thermal stresses occur in the layers and no bubbles and corrosions appear; and short circuits are avoided.

Compared to the metallization systems cited above in the prior art, the combination of the present invention exhibits many advantages thereover:

1. The employment of aluminum in micro-electronics no longer presents any difficulties. The electromigration resistance is increased due to the employment of the nucleation layer, preferably composed of titanium/titanium nitride, before the application of the aluminum interconnect level. Crystallite structure, texture, and distribution of crystallite size of the aluminum are improved. The intermediate layer composed of titanium/titanium nitride leads to a voltage dismantling between tungsten and aluminum and, thus, leads to a more reliable tungsten-to-aluminum contacting. Corrosion problems do not occur.

2. Due to the employment of tungsten depositions, via holes having a large aspect ratio (greater than 1) and a small via hole diameter (less than 1 um) exhibit a good edge coverage. High current densities are thereby possible. Further, tungsten offers the advantage of a good diffusion barrier to monocrystalline or polycrystalline silicon having low transfer resistance.

3. A low-impedance via hole metallization is achieved by the possibility of selective tungsten deposition. A reduction of the aspect ratio (improvement of the aluminum edge coverage with planarization) is also achieved.

4. Due to the employment of the cover layer, most preferably molybdenum silicide as set forth above, the aluminum metallization level, the hillock growth due to the formation of an aluminum-rich aluminum/silicon/molybdenum compound or aluminum/molybdenum compound, is suppressed and stresses between the insulating layer material and the aluminum metallization are thereby compensated for. Higher process temperatures (above 450° C.) can be accepted in the (selective) tungsten deposition or in the subsequent processes without having a texture or structure change occur in the aluminum layer due to a recrystallization. The formation of hillocks occurs due to compressive strains in the aluminum layers or at hot spots (locally high temperature gradients). When aluminum can react with the cover layer material, a strain dismantling occurs and the reaction prevents the puncture of the cover layer, avoiding whiskers. The electromigration resistance is not diminished; a stable aluminum structure is also guaranteed given temperatures above 450° C.

5. The metallization pattern can be continued for a plurality of metallization levels and is therefore especially well-suited for wiring VLSI semi-conductor circuits.

DETAILED DESCRIPTION OF THE PRESENTLY PREFERRED EMBODIMENTS

The present invention provides an improved integrated semi-conductor circuit and method of making same.

Figure 1:
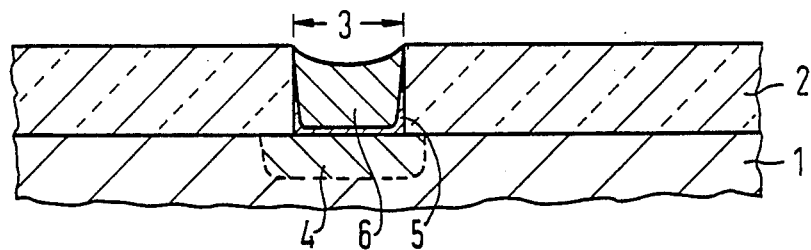
FIG. 1 illustrates a cross-sectional perspective view of the substrate illustrating the first steps in the process of the present invention.

Referring now to FIG. 1, an $SiO_2$ layer 2 into which a via hole 3 having a diameter of approximately 0.8 um has been etched, in the area of the diffused region 4 in the silicon substrate 1, is applied as a first insulating layer on the silicon substrate. The substrate 1 can be, for example, the surface of a silicon crystal wafer. After brief re-etching in hydrofluoric acid, a double layer 5 and 6 composed of a 10 nm thick tungsten-silicon alloy (1:2.5) and of an 800 nm thick, pure tungsten layer 6 is applied surface-wide onto the structure by thermic decomposition of tungsten hexafluoride with hydrogen as a reaction gas at 450° C. in a cold-wall reactor at low pressure.

The intermediate layer 5 of tungsten silicide serves as a diffusion barrier in later temperature steps. Instead of a tungsten silicide layer, a layer of titanium/tungsten (Ti/W), of titanium/tungsten nitride (Ti/W:N) or of titanium-titanium nitride (Ti/TiN) can also be used. These materials are suitable as a diffusion barrier for Si in the later tungsten deposition and following temperature steps and thereby guarantee a low-impedance contact to the diffused region. The tungsten silicide and tungsten layer present on the substrate surface 1 is etched back until only the via hole remains filled with tungsten.

Figure 2:
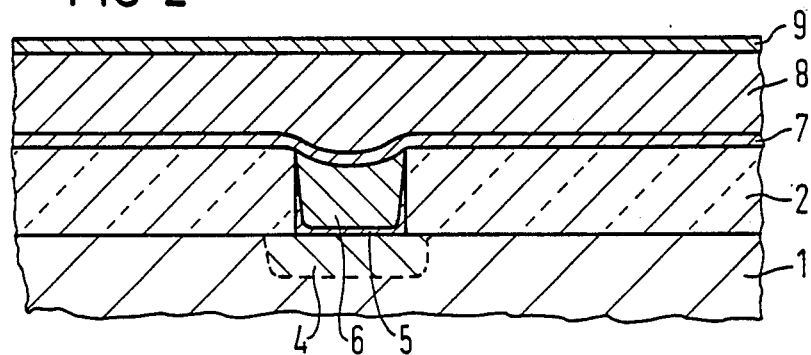
FIG. 2 illustrates a cross-sectional perspective view of the substrate illustrating the second steps of the process of the present invention.

Referring now to FIG. 2, the next steps in process include the deposition of a nucleation layer 7, composed of the combination titanium (20 nm)/titanium nitride (100 nm), for a subsequent application of the first metallization level 8 that is predominantly composed of aluminum (for example, aluminum/silicon or aluminum/silicon/titanium). Aluminum exhibits a pronounced <111> texture on titanium/titanium nitride and exhibits its extremely uniform crystallite size distribution given suitable manufacturing parameters with cathode sputtering or vapor-deposition (high growth rate 20 nm/sec., low residual gas component less than $1.10^{-6}$ pa).

The improvement of the electromigration properties of, for example, an aluminum/copper alloy is not based on the integration of the intermediate layers but is essentially based on the crystallite structure, texture, and crystallite size distribution of the aluminum thereby achieved. When the nucleation layer of, preferably Ti/TiN, exhibits a pronounced texture, this then is likewise transferred onto the aluminum layer. The grain size distribution of the aluminum is thereby determined by the structure of the nucleation layer and can thus be designated.

The titanium/titanium nitride layer 7 also leads to a stress dismantling between tungsten and aluminum (thermal expansion coefficient degrees °C. for aluminum equals $25\times10^{-6}$, for tungsten equals $4.5\times10^{-6}$, for titanium equals $8.5\times10^{-6}$) and thus leads to a hillock suppression and to a reliable aluminum/tungsten contacting. For a further discussion of this, reference is made to the Journal of Vac. Sci. Technol., A2 April–June 1984, pages 241/242 in a report by P. S. Ho and T. Kwok. As a further advantage, the Ti/TiN layer offers a defined nucleation layer for aluminum in contrast to the $SiO_2$ surface affected wtih residues after the tungsten etch-back or, respectively, selective tungsten deposition.

Figure 3:
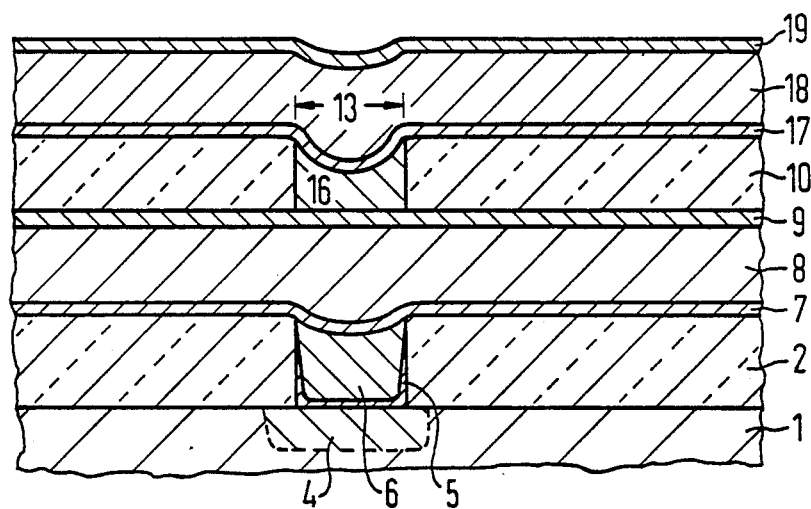
FIG. 3 illustrates a cross-sectional perspective view of the substrate illustrating further steps of the process of the present invention.

Before the second insulating layer and the second metallization level illustrated in FIG. 3 are produced, a cover layer 9, of for example molybdenum silicide, is applied to the first metallization level 8 in a layer thickness of approximately 100 nm. The cover layer 9 can be applied by cathode sputtering both from a sintered target as well as from a composite target, composed of parts of silicon and molybdenum.

Through a process (not illustrated), the triple layer is structured in the interconnect pattern.

Referring now to FIG. 3 after the deposition of the second insulating layer ($SiO_x$) 10 and after the opening of the via hole 13 by, for example, active ion etching in a freon-oxygen ($CF_4/O_2$) mixture, a selective tungsten deposition 16 ensues in the via hole 13 with tungsten hexafluoride ($WF_6$). Through formation of a volatile fluoride, or no metal fluoride (this is dependent on the process temperature and pressure), it is possible to selectively deposit tungsten in the via hole 13. For example, the following parameters are utilized:

300° C./Flow ratio $H_2/WF_6=1.53$, at a pressure of 0.42 Torr (Anicon Hot-Wall CVD)

1. The reaction, for example given $TiSi_2$ is $WF_6+3/2$ Ti - - - W+3/2 $TiF_4$ 2. Filling $WF_6+3\ H_2$ - - - W+6 HF A reduction of the aspect ratio as well as a low-impedance via hole metallization 16 are thus achieved. The second titanium/titanium nitride layer 17 deposited thereon is generated as set forth in the discussion of FIG. 2. Likewise, the second metallization level 18 is generated as set forth in the discussion of FIG. 2. Subsequently, a second cover layer 19, constructed of for example molybdenum silicide, is applied to the second metallization level 18, as described in the discussion of FIG. 2 above, and is structured. The cover layers 9 and 19, most preferably constructed from molybdenum silicide, also serve for hillock suppression that they form aluminum-rich aluminum/silicon/molybdenum or aluminum/molybdenum compounds. Strains between the insulating layers and the metallization levels are thereby compensated.

Given employment of $SiO_x$ dielectrics manufactured with bias sputtering by cathode sputtering, damage to the aluminum due to back-sputtering effects at the beginning of the deposition are avoided, since the back-sputtering rate of the silicide is lower than that of the aluminum.

Figure 4:
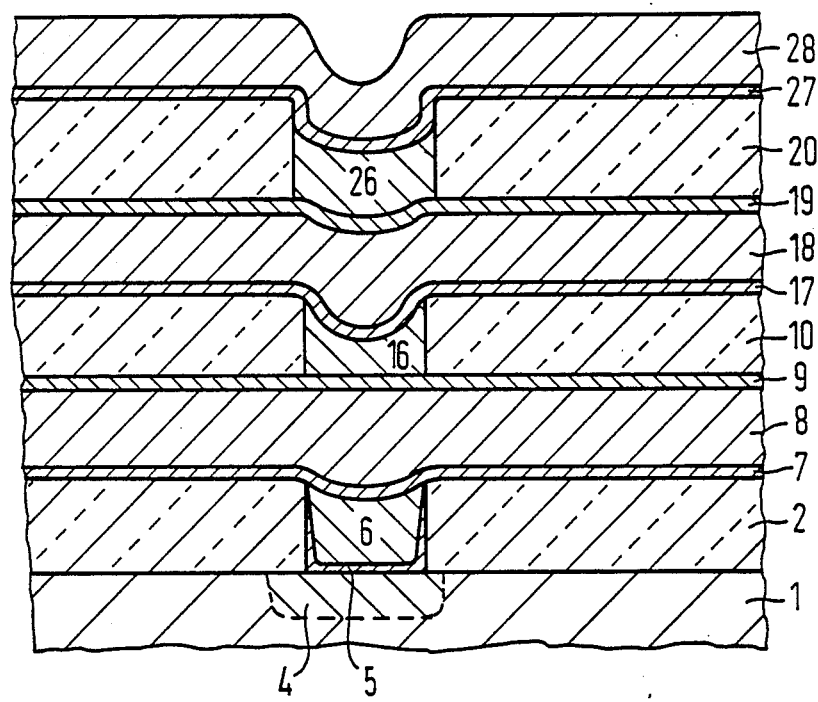
FIG. 4 illustrates a cross-sectional perspective view illustrating how a metallization pattern can be applied for a plurality of metallization levels.
Figure 5:
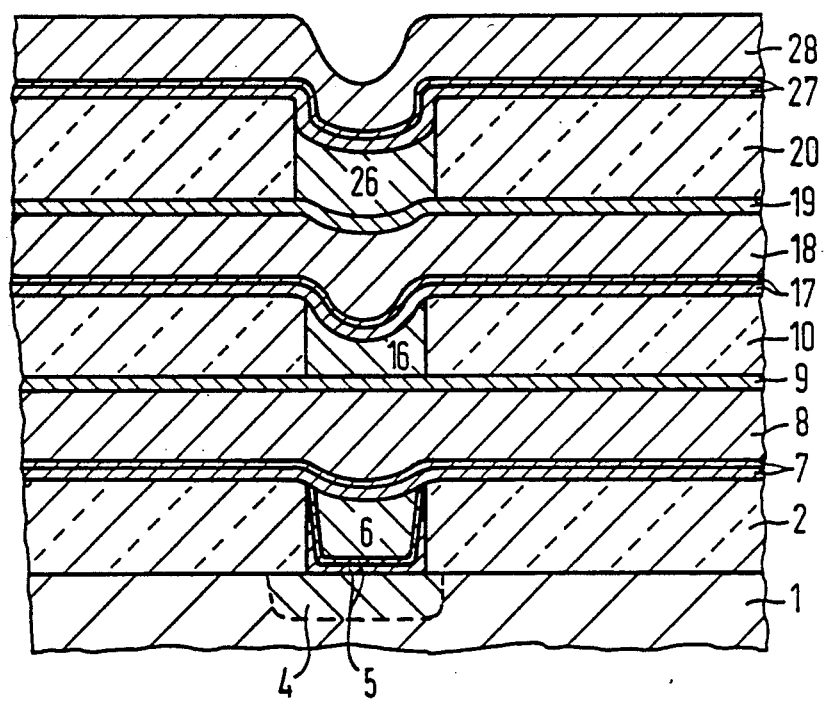
FIG. 5 illustrates a cross-sectional perspective view of an embodiment of the semi-conductor circuit of the present invention wherein the first intermediate layer is composed of a double layer and the three nucleation layers are composed of double layers.

FIG. 4 illustrates how the metallization pattern of the present invention can be applied for a plurality of metallization levels. For example, FIG. 4 illustrates three metallization levels. As illustrated, a third insulating layer ($SiO_x$) 20, a second via hole filled with tungsten 26, a third nucleation layer composed of titanium/titanium nitride 27, and a third metallization level 28 are provided.

It should be understood that various changes and modifications to the preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

I claim:

1. An integrated semi-conductor circuit including a substrate composed of silicon and at least two metallization levels composed of aluminum or of an aluminum compound and separated by an insulating layer, said metallization levels being connected to one another and to regions in the silicon substrate which are to be contacted, by intermediate layers and contact hole fillers composed of tungsten, the circuit further comprising:

a first intermediate layer chosen from the group consisting of tungsten silicide ($WSi_x$), titanium/tungsten, titanium/tungsten nitride, and titanium nitride on the regions in the silicon substrate which are to be contacted;

further intermediate layers composed of metal silicide arranged on the respective metallization levels as cover layers; and nucleation layers for improving the metallization and the electromigration resistance of aluminum, arranged under the respective metallization levels.

2. The integrated semi-conductor circuit of claim 1 wherein the cover layers are composed of molybdenum silicide ($MoSi_2$).

3. The integrated semi-conductor circuit of claim 1 wherein the nucleation layers are composed of double layers of titanium/titanium nitride.

4. The integrated semi-conductor circuit of claim 2 wherein the nucleation layers are composed of double layers of titanium/titanium nitride.

5. The integrated semi-conductor circuit of claim 3 wherein the double layers include titanium layers having layer thicknesses of approximately 10 to about 30 nm and titanium nitride layers having thicknesses of approximately 50 to about 150 nm.

6. The integrated semi-conductor circuit of claim 4 wherein the double layers include titanium layers having layer thicknesses of approximately 10 to about 30 nm and titanium nitride layers having thicknesses of approximately 50 to about 150 nm.

7. The integrated semi-conductor circuit of claim 1 wherein the cover layers are constructed from molybdenum silicide and have thicknesses of approximately 50 to about 200 nm.

8. The integrated semi-conductor circuit of claim 5 wherein the cover layers are constructed from molybdenum silicide and have thicknesses of approximtely 50 to about 200 nm.

9. The integrated semi-conductor circuit of claim 1 wherein the first intermediate layer has a thickness of approximately 5 to about 30 nm.

10. The integrated semi-conductor circuit of claim 8 wherein the first intermediate layer has a thickness of approximately 5 to about 30 nm.

11. The integrated semi-conductor circuit of claim 1 wherein the first intermediate layers in the contact holes are formed of tungsten silicide by deposition from the vapor phase given titanium/tungsten, titanium/tungsten/nitride or titanium/nitride, from deposition by cathode sputtering.

12. The integrated semi-conductor circuit of claim 1 wherein the cover layers are constructed from molybdenum silicide and the nucleation layers are constructed from titanium/titanium nitride and both are produced by cathode sputtering.

13. The integrated semi-conductor circuit of claim 1 wherein the metallization levels are constructed from a compound chosen from the group consisting of aluminum, aluminum/silicon, aluminum/copper, aluminum/copper/silicon, and aluminum/silicon/titanium and are produced by cathode sputtering or vapor deposition.

* * * * *